(12) United States Patent
Lewis (10) Patent No.: US 7,315,449 B2
(45) Date of Patent: Jan. 1, 2008

(54) APPARATUS FOR SUPPORTING A HEATSINK

(75) Inventor: Jeffrey M. Lewis, Maynard, MA (US)

(73) Assignee: EMC Corporation, Hopkinton, MA (US)

( * ) Notice: Subject to any disclaimer, the term of this patent is extended or adjusted under 35 U.S.C. 154(b) by 87 days.

(21) Appl. No.: 11/324,974

(22) Filed: Jan. 3, 2006

(65) Prior Publication Data

US 2007/0153482 A1 Jul. 5, 2007

(51) Int. Cl.
  *H05K 7/20* (2006.01)
(52) U.S. Cl. ............... 361/702; 361/704; 361/709; 361/719; 165/80.3; 257/718; 257/719
(58) Field of Classification Search ........ 361/683–687, 361/702–710, 725–728, 732, 735, 740, 741, 361/742, 747, 748, 756, 758, 759, 790, 801, 361/802, 803, 807, 810; 211/41.12, 41.17; 312/223.1, 223.2, 223.3; 174/16.1, 16.3; 257/706–727; 24/289, 458; 165/80.3, 80.2, 165/185; 248/505, 510
See application file for complete search history.

(56) References Cited

U.S. PATENT DOCUMENTS

| | | | | |
|---|---|---|---|---|
| 5,305,185 A | * | 4/1994 | Samarov et al. | 361/704 |
| 6,362,978 B1 | * | 3/2002 | Boe | 361/825 |
| 6,400,577 B1 | * | 6/2002 | Goodwin et al. | 361/816 |
| 6,545,879 B1 | * | 4/2003 | Goodwin | 361/807 |
| 6,549,410 B1 | * | 4/2003 | Cohen | 361/704 |
| 6,611,431 B1 | * | 8/2003 | Lee et al. | 361/719 |
| 6,937,476 B1 | * | 8/2005 | Chen et al. | 361/756 |
| 7,042,727 B2 | * | 5/2006 | Ulen et al. | 361/704 |
| 7,064,957 B1 | * | 6/2006 | Liang et al. | 361/719 |
| 7,110,264 B2 | * | 9/2006 | Chen et al. | 361/801 |
| 7,212,400 B2 | * | 5/2007 | Fan et al. | 361/684 |
| 2006/0007659 A1 | * | 1/2006 | Lee et al. | 361/704 |
| 2006/0219385 A1 | * | 10/2006 | Bell et al. | 165/80.2 |
| 2006/0245165 A1 | * | 11/2006 | Lin | 361/704 |
| 2007/0064404 A1 | * | 3/2007 | Dean | 361/810 |

\* cited by examiner

*Primary Examiner*—Michael Datskovskiy
(74) *Attorney, Agent, or Firm*—Guerin & Rodriguez, LLP; Michael A. Rodriguez (57) ABSTRACT

Described is an apparatus for use supporting a heatsink thermally coupled to an integrated circuit component disposed on a first side of a circuit board. The heatsink has an opening that is aligned with an opening of the circuit board. The apparatus includes a support stud disposed beneath the heatsink on a second side of the circuit board. The support stud has a bore and is press fit into the opening of the circuit board from the second side and secured within the opening of the circuit board by a fastener passing through the aligned openings of the heatsink and the circuit board and into the bore. A capture mechanism, disposed on a surface adjacent and parallel to the second side of the circuit board, receives the support stud, thereby coupling the circuit board to the adjacent surface.

18 Claims, 6 Drawing Sheets

FIG. 6

APPARATUS FOR SUPPORTING A HEATSINK

RELATED APPLICATION

This patent application may be related to the following commonly owned co-pending United States patent application: "RAID Data Storage System with SAS Expansion," by Bailey et al., application Ser. No. 11/238,601, filed on Sep. 29, 2005, the entirety of which application is incorporated by reference herein.

FIELD OF THE INVENTION

The invention relates generally to circuit boards with heat-emitting integrated circuit components. More particularly, the invention relates to an apparatus for providing support to a heatsink disposed on an integrated circuit component.

BACKGROUND

Many integrated circuit (IC) components, such as microprocessors, generate considerable heat while operating. If not dissipated, this heat can become detrimental to the performance of the component. To dissipate the heat produced by such IC components, a heatsink may need to be quite large, with many radiating fins, and quite heavy, especially with respect to the size of the IC component upon which the heatsink sits. Typically, much of the heatsink overhangs the IC component (or the socket within which the IC component resides). An insufficiently secured heatsink can induce cracking of the semiconductor die within the IC component because of vibration and mechanical shock. A remedy for avoiding these potential reliability problems, therefore, is to support the heatsink firmly to eliminate movement. However, any mechanism for supporting a heatsink must often compete against the various IC components, electrical connectors, and sockets for the prime real estate of the circuit board.

SUMMARY

In one aspect, the invention features an electronics module comprising a circuit board having a first side, a second side, and an opening formed therethrough. An integrated circuit component is disposed on the first side of the circuit board. A heatsink is coupled to a heat-emitting surface of the integrated circuit component. The heatsink has an opening extending therethrough. The opening of the heatsink is aligned with the opening of the circuit board. A support stud with a threaded bore is inserted into the opening of the circuit board from the second side of the circuit board. A threaded fastener passes through the opening of the heatsink and the opening of the circuit board and enters the threaded support stud, thereby securing the heatsink to the circuit board. A capture mechanism is disposed on a surface adjacent the circuit board. The capture mechanism receives the support stud, thereby coupling the circuit board to the adjacent surface.

In another aspect, the invention features a circuit board having a first side, a second side, and an opening formed therethrough. The circuit board comprises an integrated circuit component disposed on the first side of the circuit board and a heatsink thermally coupled to a heat-emitting surface of the integrated circuit component. The heatsink has an opening extending therethrough. The opening of the heatsink is aligned with the opening of the circuit board. The circuit board also includes a support stud having a threaded bore. The support stud is inserted into the opening of the circuit board from the second side of the circuit board. A threaded fastener passes through the opening of the heatsink and the opening of the circuit board and enters the threaded support stud, thereby securing the heatsink to the circuit board.

In still another aspect, the invention features an apparatus for use in supporting a heatsink thermally coupled to an integrated circuit component disposed on a first side of a circuit board. The heatsink has an opening that is aligned with an opening of the circuit board. The apparatus includes a support stud disposed beneath the heatsink on a second side of the circuit board. The support stud, with a bore, is press fit into the opening of the circuit board from the second side, and secured within the opening of the circuit board by a fastener passing through the aligned openings of the heatsink and the circuit board and into the bore. A capture mechanism, disposed on a surface adjacent and parallel to the second side of the circuit board, receives the support stud, thereby coupling the circuit board to the adjacent surface.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Embodiments of the present invention include a heatsink support system for providing a firm support for a heatsink. In general, the heatsink sits affixed on a heat-emitting surface of an integrated circuit (IC) component. The IC component with the heatsink resides on one side of a printed circuit board. Heatsink fasteners secure the heatsink to the printed circuit board. (The same heatsink fasteners normally used for this purpose can work with the heatsink support system too.) Instead of tightening into a threaded nut, at least one of the heatsink fasteners tightens into a threaded support stud. Accordingly, the support system requires no more room on a printed circuit board than already allocated to the threaded nuts for receiving the heatsink fasteners. Each support stud replaces a threaded nut and fits into one of the openings in the printed circuit board.

In general, each support stud has a particular size and shape for entering a corresponding capture mechanism on a rigid surface disposed adjacent to the printed circuit board. This rigid surface can be, for example, a chassis base or another printed circuit board (anchored to a chassis base). After each capture mechanism receives a support stud, a lock mechanism prevents the printed circuit board from moving relative to the rigid surface, thereby ensuring each support stud remains in place within its capture mechanism. Thus, each support stud, each capture mechanism, and the lock mechanism cooperate to secure the printed circuit board firmly to the rigid surface. Disposed directly opposite the heatsink on the other side of the printed circuit board, each joined support stud and capture mechanism provides a proximate and firm support for the heatsink. Firmly supporting the heatsink operates to minimize or eliminate the deleterious effects of vibration and mechanical shock upon the integrated circuit component.

Figure 1:
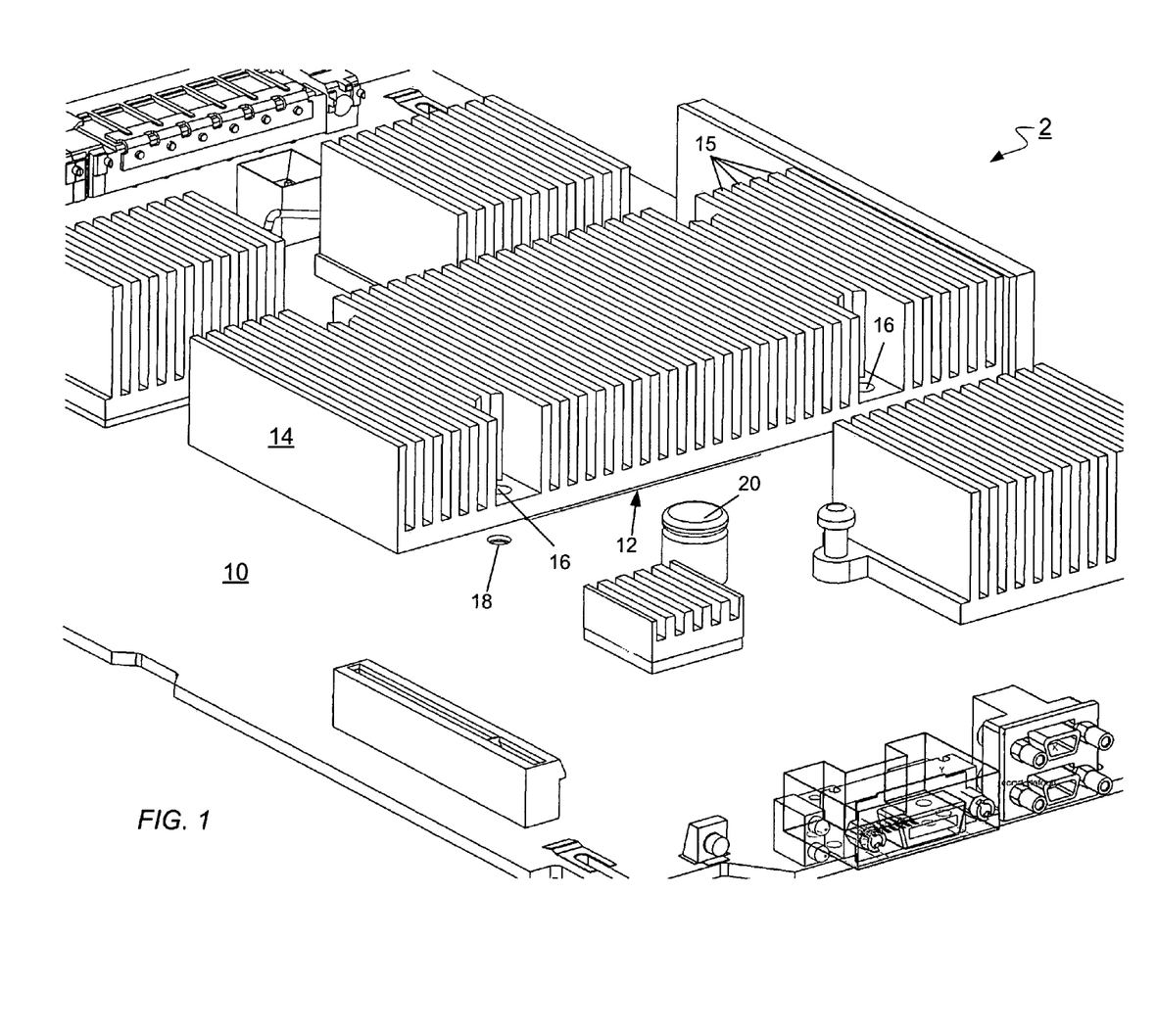
FIG. 1 is an elevated view of a printed circuit board having an integrated circuit component and a heatsink thermally coupled to the surface of the integrated circuit component.

FIG. 1 shows an example of an electronics system environment 2 in which a heatsink support system of the present invention can be embodied. The electronics system environment 2 includes a printed circuit board 10 having a socket 12 for holding an integrated circuit (IC) component (not visible), with a heatsink 14 abutting a top surface of the IC component for conducting heat away from the IC component. Thermal grease may be disposed between the IC component and the heatsink 14 to facilitate the conduction of heat. The heatsink 14 has a plurality of heat-conducting fins 15 and a plurality of openings 16 (only two of which can be seen). Each opening 16 is aligned with an opening 18 in the printed circuit board 10.

The size of the heatsink 14, in length, width, and height, is large relative to the size of the IC component. As shown, the heatsink 14 overhangs all sides of the socket 12. The heatsink 14 shown in FIG. 1 is an illustrative example of just one type of heatsink that can benefit from the invention; use of the invention applies to other types of heatsink as well, namely, heatsinks of different sizes, of different shapes, heatsinks that dissipate heat passively, and those that dissipate heat actively (i.e., with fans).

Figure 3:
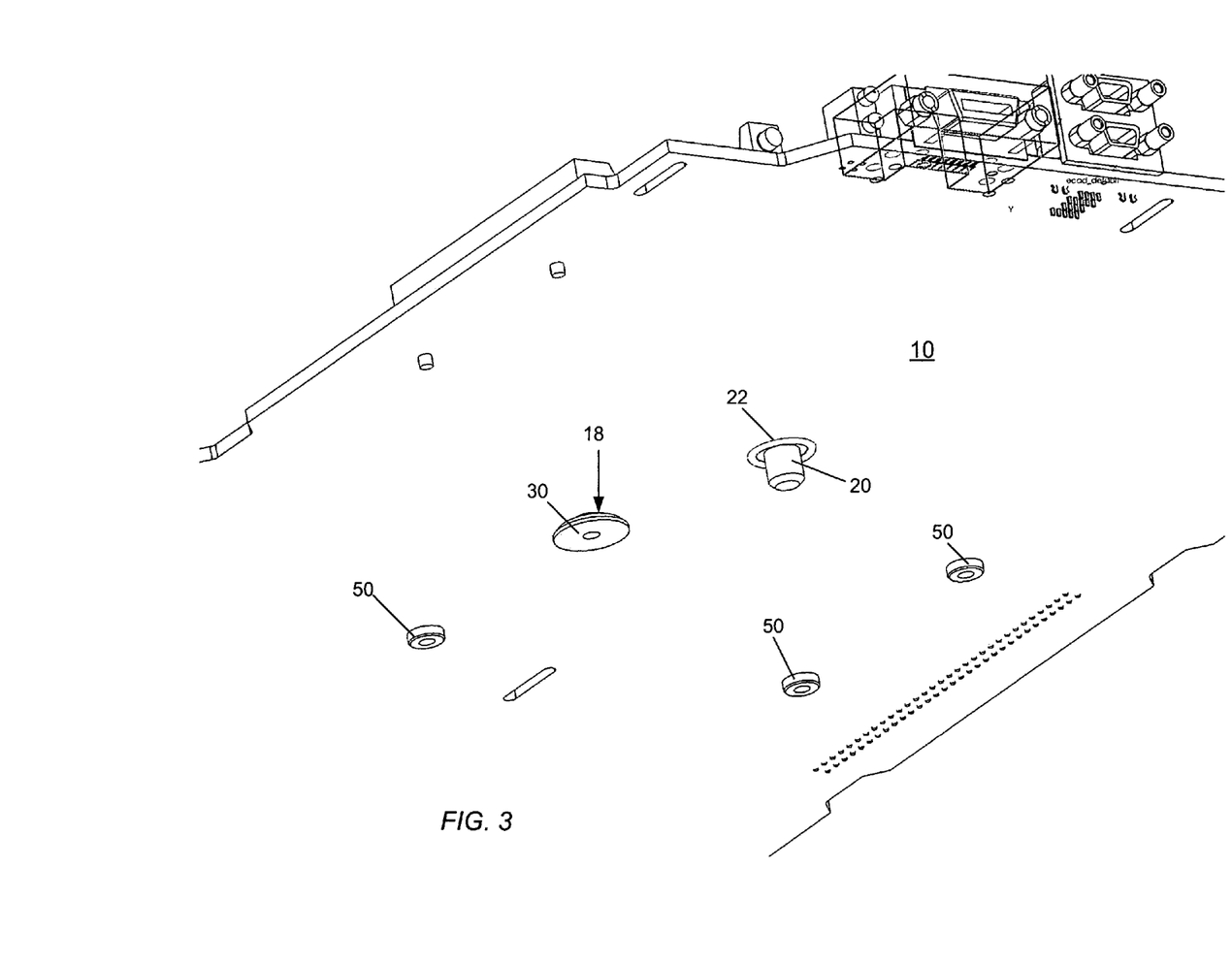
FIG. 3 is a bottom view of the printed circuit board with the heatsink support stud of FIG. 2 firmly inserted into an opening of the printed circuit board.

In one embodiment, the printed circuit board 10 also includes a retractable post 20, which extends through an opening 22 (see FIG. 3). The post 20 retracts vertically and is used as part of a lock mechanism for securing the printed circuit board 10 to an adjacent surface, as described in more detail below.

Figure 2:
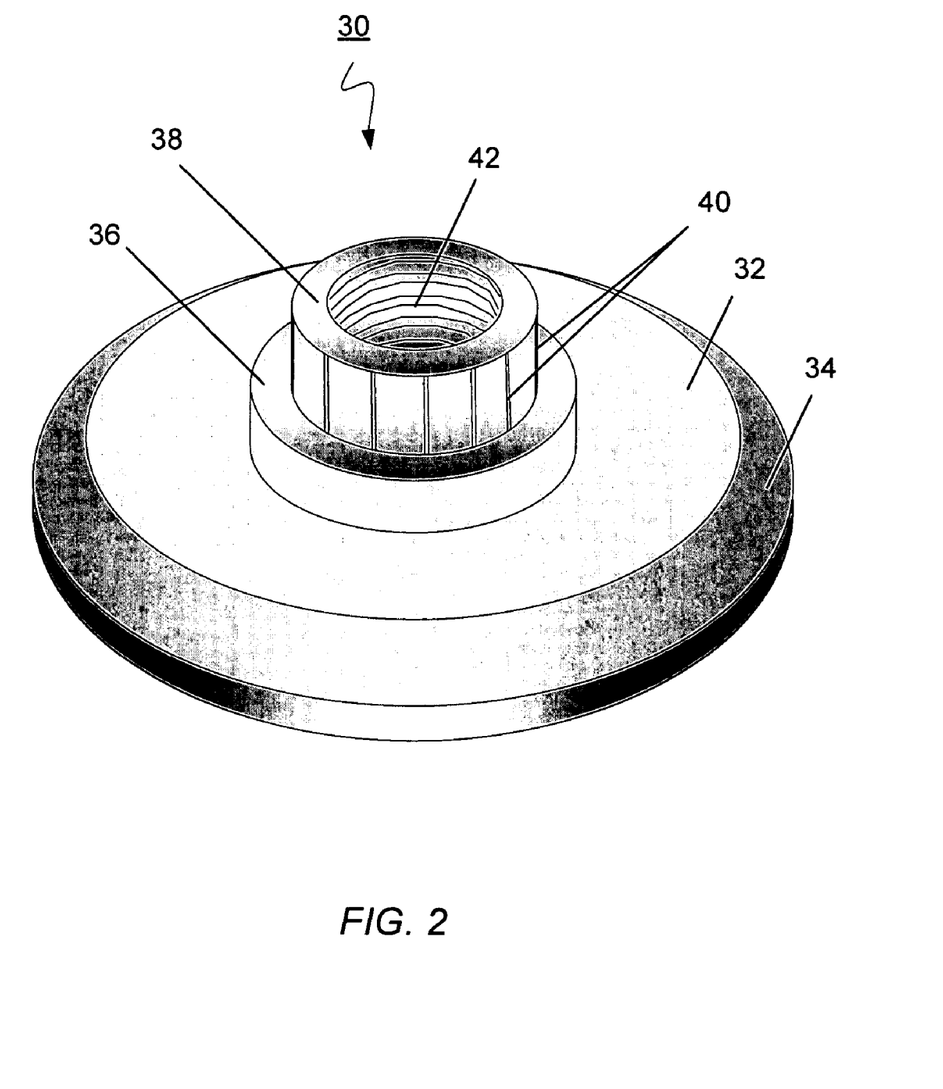
FIG. 2 is an embodiment of a heatsink support stud constructed in accordance with the invention.

FIG. 2 shows an embodiment of a heatsink support stud 30 used to secure the heatsink 14 of FIG. 1 to a firm surface, as described in more detail below. The support stud 30 is has a circular base portion 32 with a beveled edge 34, a first tier 36, and a second tier 38. The periphery of the second tier 38 includes a plurality of clinch ridges 40. A threaded bore 42 passes through the first and second tiers 36, 38 (and may extend entirely through the support stud 30).

The second tier 38 is sized to fit tightly within the opening 18 of the printed circuit board 10. The clinch ridges 40 make the outer diameter of second tier 38 equal to or slightly larger than the diameter of the opening 18. These clinch ridges 40 compress sufficiently so that the second tier 38 of the support stud 30 wedges tightly into the opening 18.

FIG. 3 shows a bottom view of the printed circuit board 10 with the heatsink support stud 30 of FIG. 2 inserted and firmly pressed into the opening 18 in the printed circuit board 10. The support stud 30 enters the opening 18 from the opposite side of the printed circuit board 10 from the heatsink 14. Also shown are three threaded nuts 50, for receiving heatsink fasteners. Although only one heatsink support stud 30 is shown in use, it is to be understood that a support stud can be used in more than one or in all of the printed circuit board openings 18. Also shown is the opening 22 through which the retractable post 20 (FIG. 1) passes therethrough.

Figure 4:
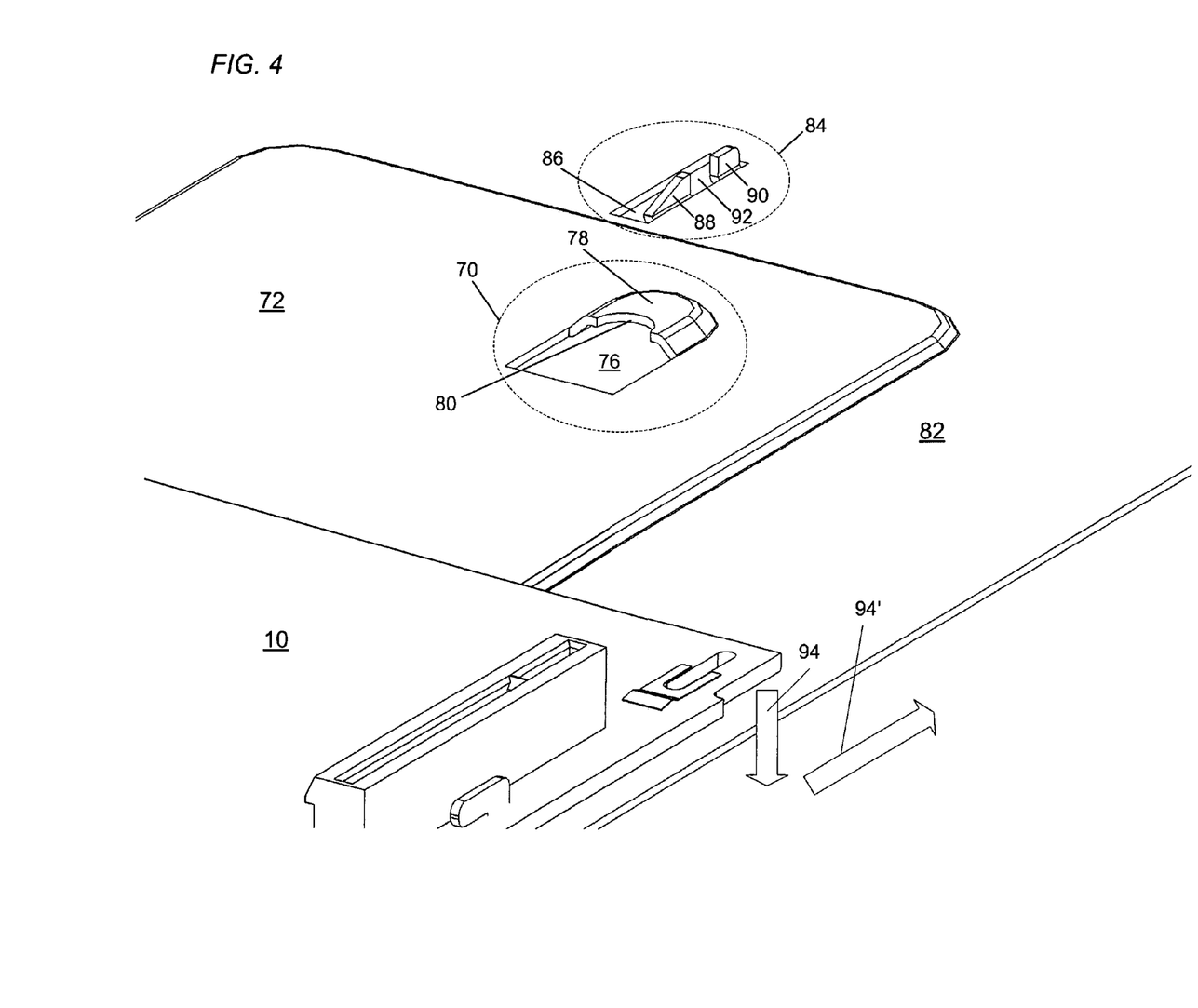
FIG. 4 is an elevated view of a capture mechanism formed in a chassis surface for receiving the heatsink support stud.

FIG. 4 shows an elevated view of a capture mechanism 70 constructed on a chassis surface 72 for receiving the heatsink support stud 30. In one embodiment, the chassis surface 72 is constructed of metal. The capture mechanism 70 includes an open portion 76 and a raised dome-shaped portion 78. The raised dome-shaped portion 78 has an arcuate side edge 80.

In the embodiment shown in FIG. 4, the chassis surface 72 is a raised section of a chassis sheet 82. The chassis sheet 82 also has a post-locking mechanism 84 comprised of an opening 86, a sloped wall 88, and a straight wall 90. A gap 92 separates the sloped wall 88 from the straight wall 90. The size of the gap 92 is such that the gap 92 can closely receive the post 20 of the printed circuit board 10 therein.

The post-locking mechanism 84 cooperates with the post 20 to lock the printed circuit board 10 in place relative to the chassis sheet 82 after the capture mechanism 70 catches the support stud 30. When the printed circuit board 10 is being slid into place in order to slide the support stud 30 into the capture mechanism 70, in the general directions indicated by arrows 94, 94', the post 20 retractably slides along the sloping edge of the sloped wall 88 until it reaches the gap 92. Upon reaching the gap 92, the post 20 fully extends and snaps into place between the sloped wall 88 and the straight wall 90. The post 20 and post-locking mechanism 84 described herein is just one example of means for locking the printed circuit board 10 to the chassis sheet 82 (after the capture mechanism 70 catches the support stud 30). Other mechanisms can be used in the practice of the invention.

Figure 5:
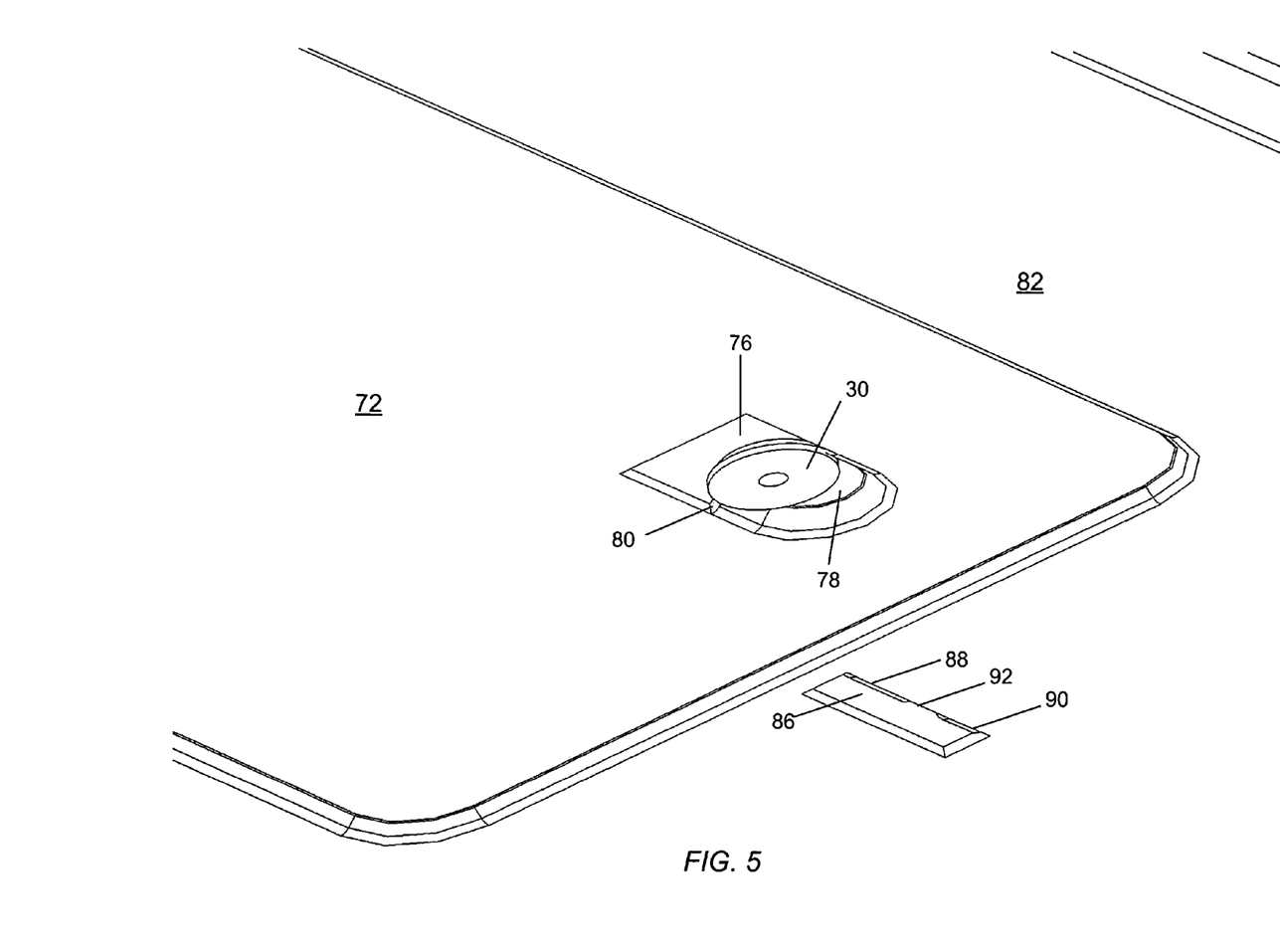
FIG. 5 is a bottom view of the heatsink support stud sliding into the capture mechanism.

FIG. 5 shows a bottom view of the chassis sheet 82 and of the chassis surface 72. The heatsink support stud 30 enters the open portion 76 and slides laterally into the dome-shaped portion 78. When inserted as far as possible into the dome-shaped portion 78, the support stud 30 abuts the arcuate edge 80 and the surface of the support stud base 32 abuts the underside of the dome-shaped portion 78, as more fully illustrated in FIG. 6.

Figure 6:
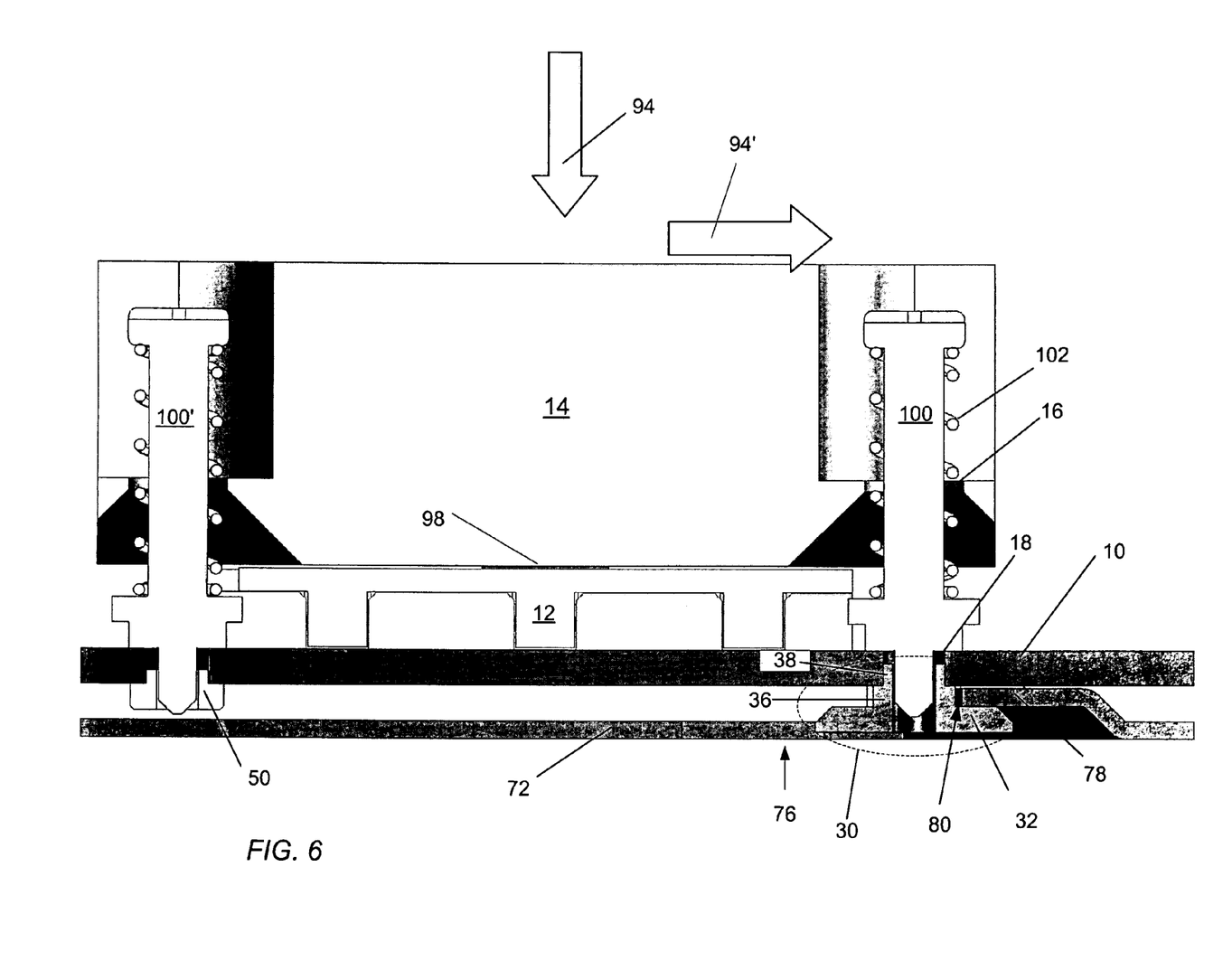
FIG. 6 is a cross-sectional view of the heatsink, printed circuit board, and heatsink support stud disposed within the capture mechanism of FIG. 4.

FIG. 6 shows a cross-section of an embodiment of the heatsink support system of the invention. As shown, the heatsink 14 abuts an external surface of the IC component 98 within the socket 12 mounted on the printed circuit board 10. The printed circuit board 10 is disposed generally parallel to the chassis surface 72. Press fit into the opening 18 of the printed circuit board 10, the support stud 30 resides beneath the socket 12 and the heatsink 14 on the opposite side of the printed circuit board 10: the second tier 38 being fully within the opening 18, and the first tier 36 abutting the surface of the printed circuit board 10 around the opening 18.

The base portion 32 of the support stud 30 resides within the capture mechanism 70. When the support stud 30 slides within the capture mechanism 70 to the fullest extent possible, part of the first tier 36 abuts the arcuate edge 80 of the capture mechanism 70 and a surface of the base portion 32 abuts the internal surface of the dome-shaped portion 78.

Arrows 94, 94' indicate the directions according to which the printed circuit board 10 is joined to the chassis surface 72. Arrow 94 indicates the direction in which the printed circuit board 10 first moves relative to the chassis surface 72 to bring the support stud 30 into the open portion 76 of the capture mechanism 70, and arrow 94' indicates the direction in which the printed circuit board 10 moves relative to the chassis surface 72 in order to slide the support stud 30 into the dome-shaped portion 78 of the capture mechanism 70.

A heatsink fastener 100 passes through the aligned openings of the heatsink 14 and printed circuit board 10 and tightens within the bore of the heatsink support stud 30. Another heatsink fastener 100' further secures the heatsink 14 to the printed circuit board 10 by tightening into the threaded nut 50. Each heatsink fastener 100 has a spring 102 coiled around its shank. The spring 102 compresses while the heatsink fastener 100 descends into the bore (or threaded nut). Other types of threaded fasteners may be used to practice the invention.

After the support stud 30 slides into the capture mechanism 70 as shown, a lock mechanism (e.g., such as the one described in FIG. 4) locks the printed circuit board 10 in place relative to the chassis surface 72. After the printed circuit board 10 is locked in place, the support stud 30 is unable to slide back out of the dome-shaped portion 78. The underside of the dome-shaped portion 78 and the close fit of the base portion 32 within the dome-shaped portion 78 prevent the support stud 30 from moving vertically away from the chassis surface 72. Accordingly, the printed circuit board 10 and chassis surface 72 joined immediately beneath the heatsink 14—on the other side of the printed circuit board 10—provide firm support for the heatsink 14. Such support should prevent or mitigate the effects of mechanical shock and vibration upon the IC component 98.

While the invention has been shown and described with reference to specific preferred embodiments, it should be understood by those skilled in the art that various changes in form and detail may be made therein without departing from the spirit and scope of the invention as defined by the following claims. For example, in the above-described embodiments, the heatsink support system joins the printed circuit board to the chassis surface. In other embodiments, the heatsink support system can be used to join the printed circuit board (with the heatsink attached thereto) to another type of adjacent surface (such as another circuit board), provided the adjacent surface can firmly support the heatsink directly or indirectly.

What is claimed is:

1. An electronics module, comprising:
a circuit board having a first side, a second side, and an opening formed therethrough;
an integrated circuit component disposed on the first side of the circuit board;
a heatsink coupled to a heat-emitting surface of the integrated circuit component, the heatsink having an opening extending therethrough, the opening of the heatsink being aligned with the opening of the circuit board;
a support stud having a threaded bore, the support stud being inserted into the opening of the circuit board from the second side of the circuit board;
a threaded fastener passing through the opening of the heatsink and the opening of the circuit board and entering the threaded support stud, thereby securing the heatsink to the circuit board; and
a capture mechanism extending from a surface adjacent the circuit board, the capture mechanism having a raised portion and an opening into which a portion of the support stud slides in order to enter the raised portion, thereby coupling the circuit board to the surface.

2. The electronics module of claim 1, wherein the support stud has a circular base and a plurality of tiers.

3. The electronics module of claim 2, wherein one of the tiers is an upper tier, and a periphery of the upper tier has clinch ridges that compress to provide close-fitting penetration of the upper tier within the opening of the circuit board.

4. The electronics module of claim 1, further comprising a means for locking the circuit board in place after the capture mechanism slidably receives the support stud.

5. The electronics module of claim 1, wherein the support stud enters the opening of the circuit board beneath the heatsink.

6. The electronics module of claim 1, wherein the raised portion of the capture mechanism has a dome shape.

7. A circuit board having a first side, a second side, and an opening formed therethrough, comprising:
an integrated circuit component disposed on the first side of the circuit board;
a heatsink thermally coupled to a heat-emitting surface of the integrated circuit component, the heatsink having an opening extending therethrough, the opening of the heatsink being aligned with the opening of the circuit board;
a support stud having a base, an upper tier, and a lower tier between the base and the upper tier, the upper tier having a threaded bore, the upper tier being sized to fit tightly into the opening of the circuit board, the lower tier being sized larger than the opening of the circuit board to limit an extent of insertion of the support stud into the opening of the circuit board, and the base being larger than the lower tier, the support stud being inserted into the opening of the circuit board from the second side of the circuit board to the extent limited by the lower tier such that the lower tier and base project from the second side of the circuit board and form a gap between the second side of the circuit board and a surface of the base that opposes the second side of the circuit board; and
a threaded fastener passing through the opening of the heatsink and the opening of the circuit board and entering the threaded support stud, thereby securing the heatsink to the circuit board.

8. The circuit board of claim 7, wherein the base of the support stud is circular.

9. The circuit board of claim 7, wherein the upper tier has clinch ridges that compress to provide close-fitting penetration of the upper tier within the opening of the circuit board.

10. The circuit board of claim 7, further comprising a means for locking the circuit board to a support surface.

11. The circuit board of claim 7, wherein the support stud enters the opening of the circuit board beneath the heatsink.

12. An apparatus for use in supporting a heatsink thermally coupled to an integrated circuit component disposed on a first side of a circuit board, the heatsink having an opening that is aligned with an opening of the circuit board, the apparatus comprising:
a support stud disposed beneath the heatsink on a second side of the circuit board, the support stud having a bore, the support stud being press fit into the opening of the circuit board from the second side and secured within the opening of the circuit board by a fastener passing through the aligned openings of the heatsink and the circuit board and into the bore; and
a capture mechanism extending from a surface adjacent and parallel to the second side of the circuit board, the capture mechanism having a raised portion and an opening into which a portion of the support stud slides in order to enter the raised portion, thereby coupling the circuit board to the surface.

13. The apparatus of claim 12, wherein the support stud has a circular base portion and a plurality of tiers.

14. The apparatus of claim 13, wherein one of the tiers is an upper tier, and a periphery of the upper tier has clinch ridges, the clinch ridges making a diameter of the upper tier equal to or larger than the opening of the circuit board for closely fitting therein.

15. The apparatus of claim 12, wherein the raised portion of the capture mechanism has a dome shape.

16. The apparatus of claim 12, further comprising a means for locking the circuit board in place relative to the surface after the capture mechanism receives the support stud.

17. The circuit board of claim 7, wherein a thickness of the lower tier determines a size of the gap between the second side of the circuit board and the opposing surface of the base.

18. The circuit board of claim 7, wherein the surface of the base that opposes the second side of the circuit board has a sloped periphery for guiding an edge of a capture mechanism into the gap between the second side of the circuit board and the base.

* * * * *